(12) United States Patent
Nakajima et al.

(10) Patent No.: US 8,727,202 B2
(45) Date of Patent: May 20, 2014

(54) DIE BONDER AND BONDING METHOD

(75) Inventors: Nobuhisa Nakajima, Kumagaya (JP);
Fukashi Tanaka, Kumagaya (JP);
Hiroshi Maki, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 0 days.

(21) Appl. No.: 13/585,905

(22) Filed: Aug. 15, 2012

(65) Prior Publication Data

US 2013/0071956 A1 Mar. 21, 2013

(30) Foreign Application Priority Data

Sep. 19, 2011 (JP) ................................ 2011-203951

(51) Int. Cl.
*B23K 31/02* (2006.01)

(52) U.S. Cl.
USPC ....................................... 228/103; 228/180.1

(58) Field of Classification Search
None
See application file for complete search history.

(56) References Cited

U.S. PATENT DOCUMENTS

| | | | | |
|---|---|---|---|---|
| 6,201,306 | B1* | 3/2001 | Kurosawa et al. | 257/783 |
| 6,244,493 | B1* | 6/2001 | Shimazaki et al. | 228/5.5 |
| 2006/0005911 | A1* | 1/2006 | Kubo et al. | 156/84 |
| 2006/0019428 | A1* | 1/2006 | Kurosawa et al. | 438/114 |
| 2007/0084901 | A1* | 4/2007 | Gaunekar et al. | 228/4.5 |
| 2007/0272727 | A1* | 11/2007 | Yang | 228/101 |
| 2007/0287262 | A1* | 12/2007 | Maki et al. | 438/455 |
| 2008/0318346 | A1* | 12/2008 | Maki et al. | 438/7 |
| 2009/0126188 | A1* | 5/2009 | Sakai et al. | 29/832 |
| 2010/0083494 | A1* | 4/2010 | Lee et al. | 29/832 |
| 2010/0233867 | A1* | 9/2010 | Akiyama et al. | 438/464 |
| 2011/0290427 | A1* | 12/2011 | Maki et al. | 156/707 |
| 2012/0241096 | A1* | 9/2012 | Yamagami et al. | 156/535 |
| 2012/0329211 | A1* | 12/2012 | Maki et al. | 438/107 |
| 2013/0122615 | A1* | 5/2013 | Kobashi et al. | 438/16 |
| 2013/0130408 | A1* | 5/2013 | Maki et al. | 438/5 |

FOREIGN PATENT DOCUMENTS

| | | |
|---|---|---|
| JP | 10-189690 A | 7/1998 |
| JP | 2002-184836 A | 6/2002 |
| JP | 2004-186352 A * | 2/2004 |
| JP | 2005-117019 A * | 4/2005 |
| JP | 2005-322815 A * | 11/2005 |
| JP | 2007-42996 A | 2/2007 |
| KR | 10-2008-0112127 | 12/2008 |

OTHER PUBLICATIONS

Korean Office Action dated Aug. 31, 2013 (five (5) pages).

* cited by examiner

*Primary Examiner* — Kiley Stoner
(74) *Attorney, Agent, or Firm* — Crowell & Moring LLP (57) ABSTRACT

With a die bonder or a bonding method, the die is adsorbed by the collet, the dicing tape to which the die is adsorbed is thrust up, the die adsorbed by the collet, and thrust up is peeled from the dicing tape, and the peeled die is bonded to the substrate. When the decrease in the air leak flow rate through the gap between the collet and the die upon the thrust up is smaller than the decrease in the normal peel by a predetermined amount, it is judged that a deflection occurs in the die.

7 Claims, 8 Drawing Sheets

DIE BONDER AND BONDING METHOD

BACKGROUND OF THE INVENTION

The present invention relates to a die bonder and a bonding method, and more particularly, to a die bonder and a bonding method which are highly reliable.

RELATED ART

A process of assembling a package by mounting a die (semiconductor chip)(hereinafter simply referred to as a die) onto a substrate such as a wiring substrate and a lead frame includes a step of separating a die from a semiconductor wafer (hereinafter simply referred to as a wafer), and a die bonding step of bonding the separated dies onto the substrate.

The bonding step includes a peeling step that peels the dies separated from the wafer. In the peeling step, each die is peeled from a dicing tape held by a pickup device one by one, and is further conveyed onto the substrate using a suction jig called collet.

JP-A No. 2002-184836 and JP-A No. 2007-42996 disclose the peeling step as generally employed technique. JP-A No. 2002-184836 discloses that a group of first thrust-up pins provided at four corners of the die, and a group of second thrust-up pins provided at the center or peripheral portion of the die each having a leading end lower than that of the first thrust-up pin are attached to a pin holder which is lifted for peeling.

JP-A No. 2007-42996 discloses that three blocks are arranged so as to allow the thrust-up height to be higher as the position is closer to the center of the die. A protrusion that protrudes toward the corner of the die is integrally formed at each of the four corners of the block at the outermost side so that the three blocks are sequentially thrust up.

The above-described related art monitors the flow rate of the air leaking to the collet when picking up of the die to judge whether or not crack occurs in the die.

SUMMARY OF THE INVENTION

Recently, an effort to reduce the package thickness has been in progress for the purpose of promoting high-density packaging of a semiconductor device. Especially, the stacked package that allows a plurality of dies to be three-dimensionally mounted onto the wiring substrate of the memory card has been put into practical use. Assembly of the stacked package requires reduction of the die thickness to 20 μm or smaller in order to prevent increase in the package thickness.

As the thickness of the die is reduced, rigidity of the die is significantly deteriorated compared to the adhesive power of the dicing tape. This may cause the risk of increasing the possibility to cause the crack in the die to be higher than the generally employed case. It is therefore important to monitor whether or not the crack occurs in the die when conducting the multistage thrust-up pin method using the groups of the first and the second pins with different heights as disclosed in JP-A No. 2002-184836, and the multistage block method with protruding portion as disclosed in JP-A No. 2007-42996.

However, the generally employed technique is not capable of judging occurrence of deflection if no crack occurs. Especially, even a large deflection amount which may cause the non-conforming product cannot be detected.

The present invention provides a highly reliable die bonder capable of judging occurrence of the deflection in the case where no crack occurs in the die.

Characteristics of the present invention will be described as below.

The present invention provides a die bonder and a bonding method as a first characteristic that the die is adsorbed by the collet, the dicing tape to which the die is adsorbed is thrust up, the die adsorbed by the collet, and thrust up is peeled from the dicing tape is placed on a substrate, and the peeled die is bonded to the substrate. When a decrease in an air leak flow rate through the gap between the collet and the die upon the thrust up is smaller than the decrease in the normal peel by a predetermined amount, a first judgment is made that a deflection occurs in the die.

As a second characteristic of the present invention, the first judgment is made based on the decrease in the air leak flow rate by means of a differential value.

As a third characteristic of the present invention, a second judgment is made that a crack occurs in the die when the air leak flow rate becomes constant or substantially constant.

As a fourth characteristic of the present invention, the first judgment is made that the peel is normally done in spite of the deflection when the air leak flow rate becomes equal to or smaller than a first predetermined value, or the decrease in the air leak flow rate is equal to or smaller than a second predetermined value within a predetermined time.

As a fifth characteristic of the present invention, the thrust up operation thrusts the dicing tape upward at a predetermined portion of a peripheral portion of the die to form a peel start point. A judgment is made with respect to the deflection upon formation of the peel start point.

As a sixth characteristic of the present invention, the peel start point is formed at the predetermined portion provided at least at one corner portion of four corner portions of the die.

The present invention provides highly reliable die bonder and bonding method which are capable of judging occurrence of the deflection even if no crack occurs in the die when it is picked up.

DESCRIPTION OF THE PREFERRED EMBODIMENTS

Embodiments of the present invention will be described referring to the drawings.

Figure 1:
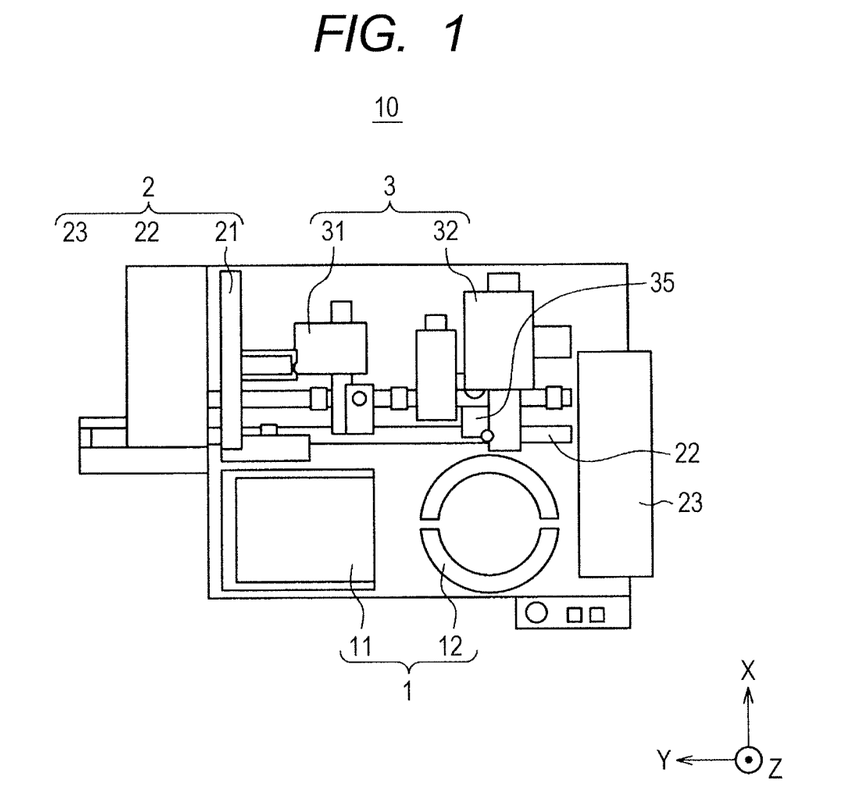
FIG. 1 is a conceptual view of a die bonder as an embodiment of the present invention when seen from above.

FIG. 1 is a conceptual view of a die bonder 10 as an embodiment of the present invention, seen from above. The die bonder is mainly formed of a wafer supply unit 1, a work supply/carry-out unit 2 and a die bonding unit 3.

The work supply/carry-out unit 2 includes a stack loader 21, a frame feeder 22 and an unloader 23. A work (substrate such as the lead frame, or the die already mounted onto the substrate) supplied to the frame feeder 22 by the stack loader 21 is conveyed to the unloader 23 via two processing positions on the frame feeder 22.

The die bonding unit 3 includes a preform portion 31 and a bonding head portion 32. The preform portion 31 applies a die adhesive agent to the incoming work fed by the frame feeder 22. The bonding head portion 32 picks up the die from a pickup device 12, and ascends to move the die in parallel to a bonding point on the frame feeder 22. The bonding head portion 32 descends the die so as to be bonded to the work to which the die adhesive agent has been applied.

The wafer supply unit 1 includes a wafer cassette lifter 11 and the pickup device 12. The wafer cassette lifter 11 includes a wafer cassette (not shown) loaded with wafer rings which are sequentially supplied to the pickup device 12.

The embodiment is of a type which allows a bonding head 35 of the bonding head portion 32 to pick up the die. Alternatively, the pickup head for exclusive use of the pickup may be added apart from the bonding head 35 so that the die picked up by the pickup head is placed at a predetermined position, and the placed die is picked up by the bonding head.

Figure 2:
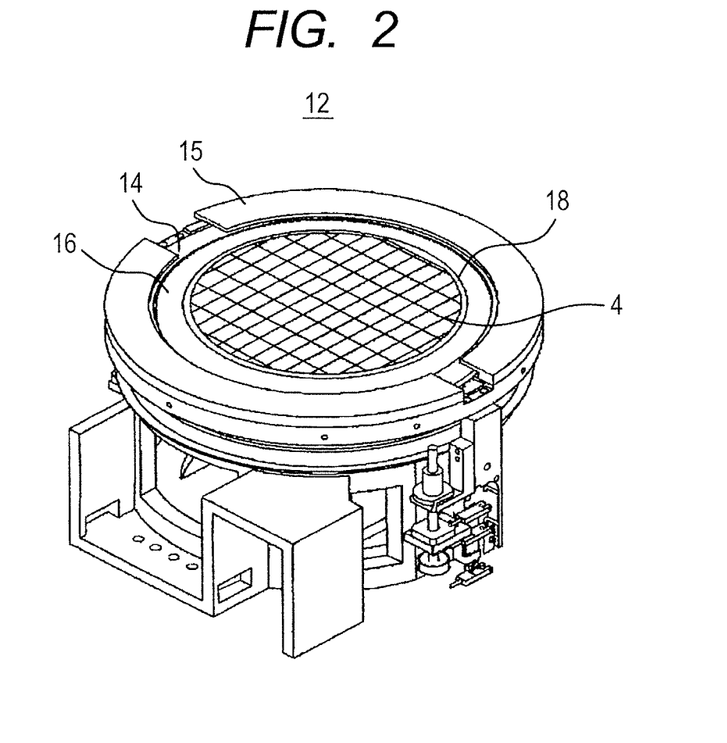
FIG. 2 is a perspective view illustrating an outer appearance of a pickup device according to the embodiment of the present invention.
Figure 3:
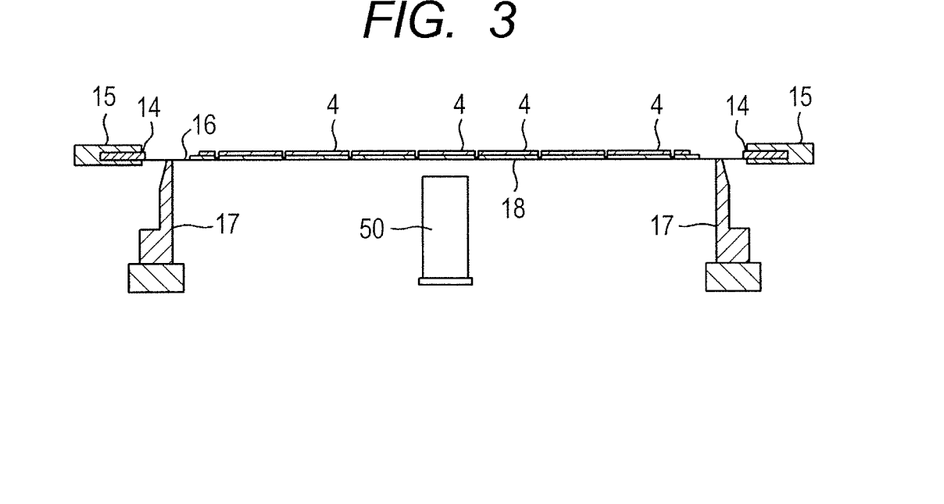
FIG. 3 is a sectional view generally showing a main part of the pickup device according to the embodiment of the present invention.

The structure of the pickup device 12 will be described referring to FIGS. 2 and 3. FIG. 2 is a perspective view showing an outer appearance of the pickup device 12. FIG. 3 is a sectional view schematically showing a main part of the pickup device 12. Referring to FIGS. 2 and 3, the pickup device 12 includes an expand ring 15 that holds the wafer ring 14, a support ring 17 that is held by the wafer ring 14, and horizontally positions the dicing tape 16 to which a plurality of dies (chip) 4 are adhered, and a thrust-up unit 50 that is provided inside the support ring 17 for thrusting the die 4 upward. The thrust-up unit 50 is configured to be driven by a not shown drive mechanism to move in a vertical direction. The pickup device 12 is moved in a horizontal direction.

The pickup device 12 descends the expand ring 15 that holds the wafer ring 14 upon thrust up of the die 4. As a result, the dicing tape 16 held by the wafer ring 14 is stretched to widen the interval between the dies 4, and the die 4 is thrust up by the thrust-up unit 50 from below so as to facilitate the pickup operation of the die 4. Along with the thickness reduction, the adhesive agent in the liquid state is transformed to be in the film state. A film-like adhesive material called a die attach film 18 is applied between the wafer and the dicing tape 16. In the case where the wafer has the die attach film 18, the dicing is performed with respect to the wafer and the die attach film 18. In the peeling step, the wafer and the die attach film 18 are peeled from the dicing tape 16.

Figure 4:
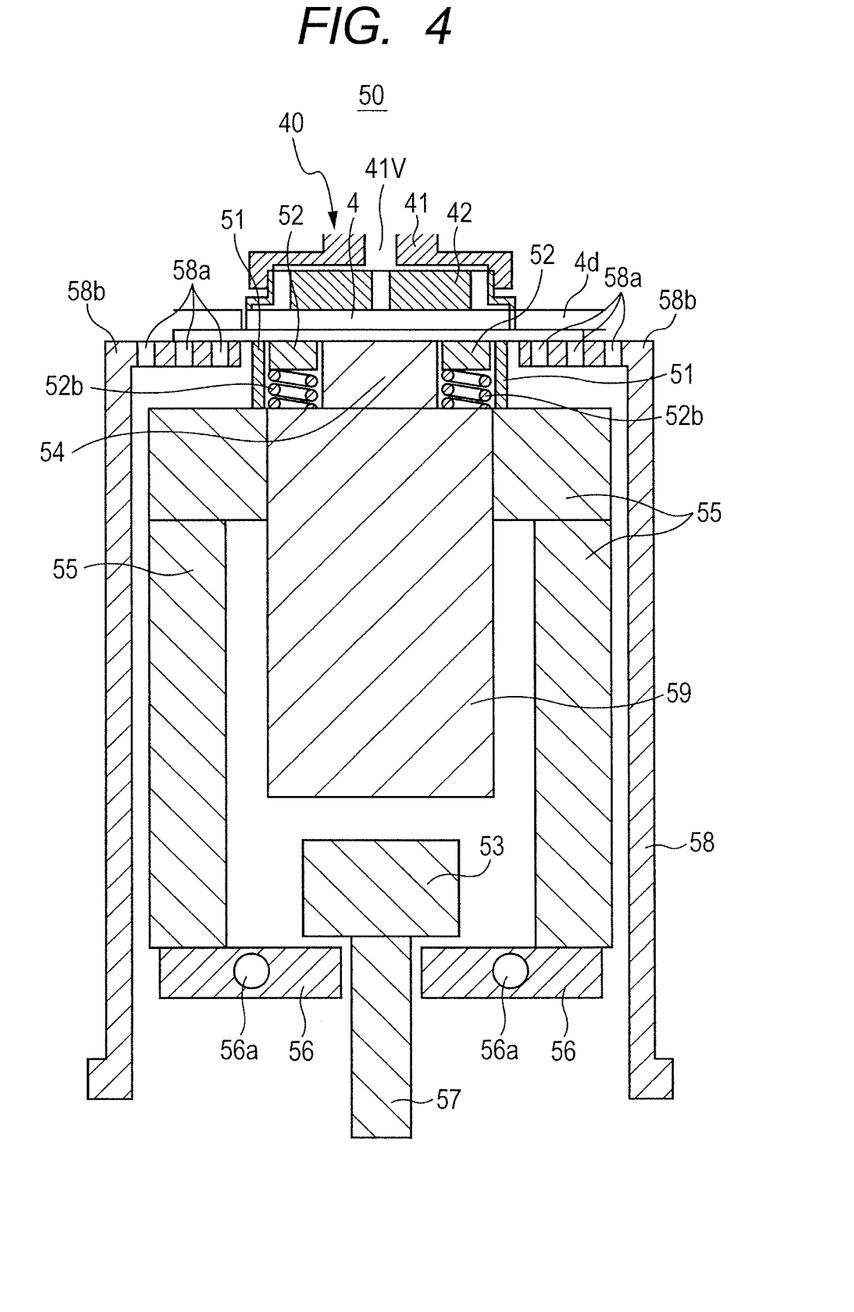
FIG. 4 illustrates a thrust-up unit and a collet portion of a bond head unit according to a first embodiment of the present invention.
Figure 5:
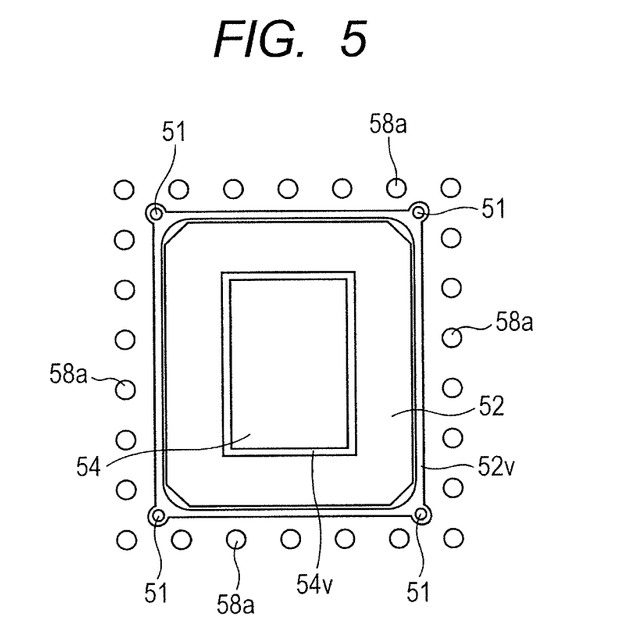
FIG. 5 is a top view of a part on which the thrust-up block portion of the thrust-up unit and peel start point forming pins exist when seen from above.

FIG. 4 shows structures of the thrust-up unit 50 and a collet portion 40 of the bond head unit (not shown) according to the embodiment of the present invention. FIG. 5 is a view of the part on which a thrust-up block portion and the pin forming a peel start point (the following, expressed as "peel start point forming pin") of the thrust-up unit exist when seen from above.

Referring to FIG. 4, the collet portion 40 includes a collet 42, a collet holder 41 that holds the collet 42, and suction holes 41v and 42v for adsorbing the die 4.

Meanwhile, the thrust-up unit 50 is mainly formed of the thrust-up block portion, the peel start point forming pin portion, a drive unit that drives the thrust-up block portion and the peel start point forming pin portion, and a dome body 58 that holds those elements as described above. The thrust-up block portion includes a block body 59, an inner block 54 directly connected to the block body 59, and an outer block 52 that is provided around the inner block via a ½ switching spring 52b and has an outer shape smaller than that of the die 4.

Referring to FIG. 5, the peel start point forming pin portion includes four peel start point forming pins 51 respectively formed outside the four corners of the outer block 52, that is, at four corners of the die, pin vertical links 55 that hold the peel start point forming pins, and are vertically movable, and pin drive links 56 that rotate around points 56a as supporting points to move the pin vertical links 55 in the vertical direction.

The drive unit includes a drive shaft 57 that is driven by a motor to move in the vertical direction, and an operation body 53 that moves vertically accompanied with the vertical motion of the drive shaft 57. When the operation body 53 descends, the left and right pin drive links 56 are rotated to ascend the pin vertical links 55 to thrust up the peel start point forming pins 51 upward. When the operation body 53 ascends, the block body is moved upward to push the outer and inner blocks upward. As described above, the pin vertical links 55 and the pin drive links 56 form an inversion portion that transforms the descending motion of the operation body 53 into the thrust up (ascending) motion of the peel start point forming pin 51.

A dome head 58b having a large number of suction holes 58a, which adsorbs and holds the die 4 is provided at the upper portion of the dome body 58. FIG. 5 shows only a unit in a single row around the block portion. However, the units in a plurality of rows are provided for the purpose of stably holding a die 4d that is not intended to be picked up. As FIG. 5 shows, a gap 54v between the inner block 54 and the outer block 52, and a gap 52v between the outer block 52 and the dome head 58b are adsorbed to hold the dicing tape 16 to the side of the block portion.

The thrust-up unit 50 as described above descends the peel start point forming pins 51 after ascending. However, they do not have to be necessarily descended. For example, the pins are ascended to form the peel start point, and then the outer and the inner blocks may be ascended as described later while holding the peel start point position.

The pickup operation performed by the above-described thrust-up unit 50 will be described referring to FIGS. 6A to 6D. FIGS. 6A to 6D show operations of a portion around the dome head 58b, and the collet portion 40 upon the pickup operation.

Figure 6A:
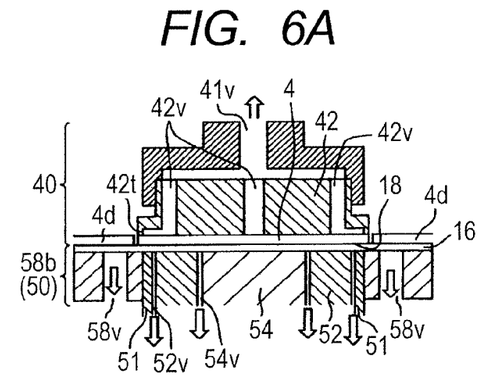
FIGS. 6A to 6D are views representing pick-up operations performed by the thrust-up unit.

Referring to FIG. 6A, the collet portion 40 descends to land on the dome head 58b of the thrust-up unit 50. At this time, the peel start point forming pins 51, the outer block 52, and the inner block 54 are in plane with the surface of the dome head 58b. The dicing tape 16 and the die 4 are placed in the plane while being in a stable posture. After the landing, the collet 42 adsorbs the die 4 by means of the suction hole 58a of the dome head 58b, and the gaps 52v and 54v between the respective blocks.

Figure 6B:
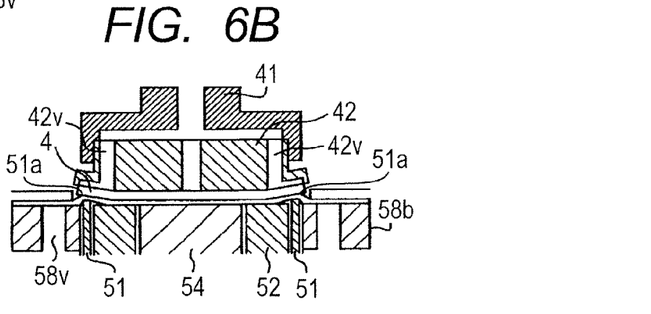

FIG. 6B shows that the peel start point forming pins 51 at four corners of the outer block 52 are only ascended by several tens to hundreds μm. The operation body 53 is descended to rotate the pin vertical links 56 around the point 56a as the supporting point, which ascends the pin vertical links 55, thus ascending the peel start point forming pins 51. As the peel start point forming pins 51 are ascended, the dicing tape 16 therearound is raised to generate a thrust-up portion. A very small space is generated between the dicing tape 16 and the die attach film 18, that is, the peel start point 51a is generated. Such space significantly reduces the anchor effect that keeps the dicing tape 16 applied to the dome head 58b, that is, the stress exerted to the die 4. This ensures the peeling operation in the subsequent step. The peel start point forming pin 51 may have its leading end with a round shape having its diameter of 700 μm or smaller, or with a flat shape so long as a very small space is generated. A flange 42t of the collet 42 is slightly deformed in connection with deformation of the die, thus preventing the air inflow.

Figure 6C:
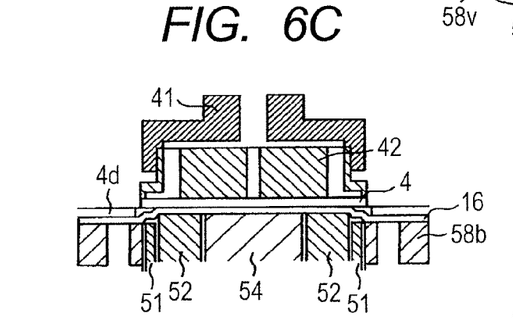

FIG. 6C shows the state where the operation body 53 is ascended to return the peel start point forming pin 51 to the original positions so that the outer block 52 and the inner block 54 are ascended together. The outer block 52 and the inner block 54 are ascended by separating the operation body 53 from the pin drive links 56, and further ascending. When the operation body 53 is separated from the pin drive links 56, the peel start point forming pin 51 is returned to the original point, which does not contribute to subsequent peeling operation. The position of the peel start point forming pin 51 may be retained without being returned to the original position.

Figure 6D:
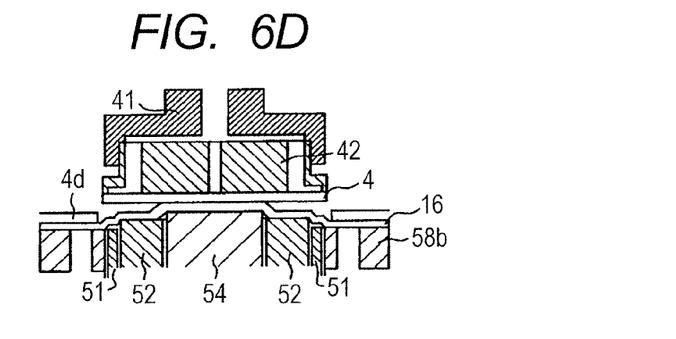

FIG. 6D shows the state where the operation body 53 is further ascended to ascend the inner block 54 only by action of the ½ switching spring 52b. In this state, the contact area between the dicing tape 16 and the die 4 is sufficient to allow peeling by ascending the collet. The die 4 is peeled off by ascending the collet 42.

As described above, the embodiment provides the peel start point forming pins 51 at positions corresponding to four corners of the die 4, which are ascended at the initial stage of the peeling process so that the space serving as the point at which the peeling starts is generated. This makes it possible to reduce the stress exerted to the die 4, and ensures the peeling process performed by the outer block 52 and the inner block 54 in the subsequent process.

This makes it possible to provide the highly reliable die bonder or the pickup method while reducing the pickup error.

The die peeling process described referring to FIGS. 6A to 6D allows the peel start point forming pins 51 to perform the die peeling process. However, the die thickness reduction may cause crack in the die 4 during the thrust-up operation as shown in FIGS. 6B, 6C and 6D, or the deflection to exceed the acceptable value, thus failing to peel the die.

Figure 7:
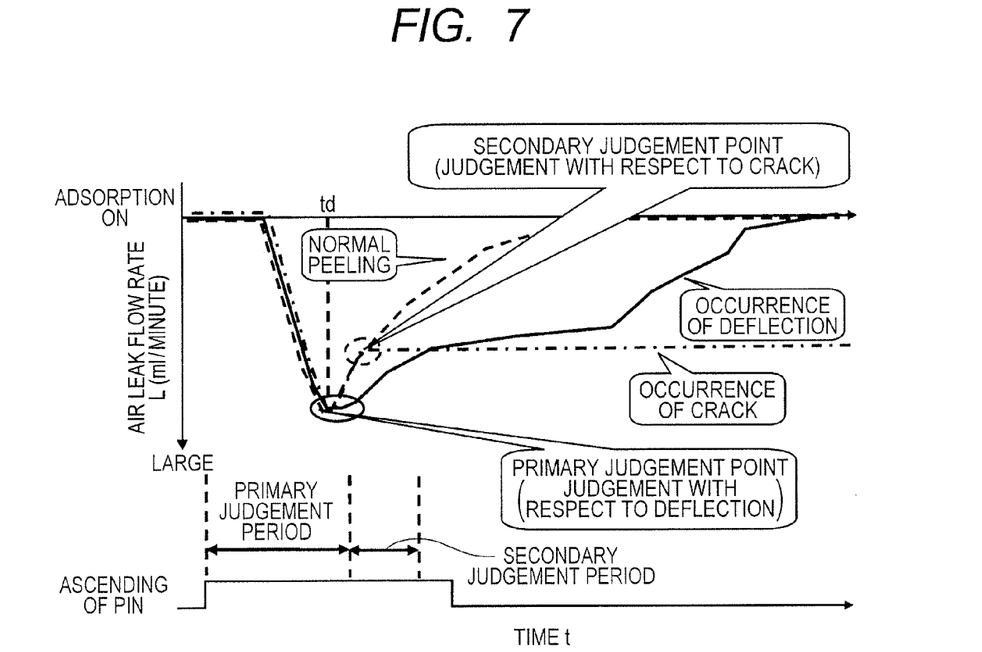
FIG. 7 is an explanatory view representing a principle of discrimination among normal peel, crack and deflection of the die upon thrust-up operation of the embodiment.

FIG. 7 is an explanatory view representing the principle for making a judgment with respect to the normal peel, crack and deflection of the die during the thrust-up operation according to the embodiment. In the embodiment, the thrust-up operation is performed in three stages of ascending a peel start point forming pin 51, the outer block 52 and the inner block 54, and the inner block 54. The upper portion of the view shown in FIG. 7 represents the change in the air leak flow rate caused by the peel start point forming pins 51. The lower portion of the view shown in FIG. 7 represents the time between the peel start point forming pins 51 is ascending, and ranges of the time between the primary judgment and the secondary judgment are performing with respect to the state of the die which will be described later.

Substantially the same change curve is obtained when ascending the outer block 52 and the inner block 52, and the inner block 54 as well although the air leak flow rate value differs. The judgment may be made in the same way as the case of the peel start point forming pins 51.

As FIG. 6A shows, when the collet 42 lands on the die to start adsorbing, the upper portion of FIG. 7 indicates that the collet 42 is in tight contact with the die and the air leak flow rate L is converged to the low flow rate. Thereafter, as FIG. 6B shows, when ascending the peel start point forming pins 51, the flange 42t of the collet 42 is deformed to suppress the air leak flow rate L in the initial stage. As the deformation at the end of the die 4 proceeds, the gap between the collet 42 and the die 4 is generated to gradually increase the air leak flow rate L until a peel start point forming time td.

Thereafter, the air leak flow rate L is decreased owing to adhesive power of the dicing tape. At this time, if there is no crack or no deflection occurs in the die 4, or the peel is normally done while having the small deflection, the air leak flow rate L is gradually decreased into convergence as indicated by the broken line.

When the crack occurs in the process of decrease in the air leak flow rate L, the air leak flow rate L hardly changes from the time point at which the crack occurs, and is kept constant or substantially constant by dashed line. In the case with a low probability where the crack occurs before formation of the peel start point, the air leak flow rate L may be kept constant or substantially constant from the time point.

When the deflection occurs in the die 4, decrease in the air leak flow rate L is alleviated in accordance with the deflection amount as indicated by the solid line. If the decrease is equal to or smaller than the predetermined value, it is returned to the normal air leak flow rate L.

Based on the phenomenon analysis, in the case where the air leak flow rate L is reversely changed from increase to decrease with the diminish curve or gradient at a predetermined level or higher, judgment is made as the normal peel, or probability of the crack. In the case where the air leak flow rate is decreased with the diminish curve or the gradient at a predetermined level or lower, it is judged that the deflection has occurred. In the case where the deflection occurs, monitoring is performed until the deflection amount is recovered to be in the predetermined range. If it is recovered, or the decrease in the deflection amount is in the range equal to or lower than the predetermined value, it is considered that the normal state is recovered. Accordingly, the judgment is made that the peel has been normally done. The former case ensures to assist with the die 4 to restore the normal state although the time for monitoring is prolonged, and the pickup processing time is also prolonged. Meanwhile, although it is likely that the latter case misses the die 4 which restores the normal state, the pickup processing time may be reduced. The aforementioned judgment will be referred to as a primary judgment. The primary judgment is made for a period from the time at which the peel start point forming pins start ascending to the time after an elapse of a predetermined time from completion of forming the peel start point.

After the elapse of the primary judgment time, the secondary judgment is made whether the air leak flow rate L is kept constant, or substantially constant, that is, the crack has occurred within a secondary judgment time as shown in FIG. 7. If the crack has not occurred, it is judged that the peel has been normally done. Supposing that the crack occurs during ascending of the peel start point forming pins 51, it is judged that the crack has occurred immediately after starting the secondary judgment.

The data processing method for the primary and the secondary judgments is conducted using the differential value of the air leak flow rate L. Alternatively, the gradient value while prolonging the time, or the diminish amount or flow rate value after an elapse of the predetermined time may be used likewise the case of the differential value. In short, may be any data processing can understand the phenomenon described above.

The description with respect to the judgment will be made taking the differential value as an example. In this case, the differential value is expressed as $\Delta BL (=\Delta L/\Delta t)$, and each suffix of j, k, 1 and 2 denotes the actual measurement value, allowable value, the primary judgment allowable value, and the secondary judgment allowable value. The judgment will be made as follows.

Primary Judgment
$\Delta BLj \geq \Delta BLk1$: normal peel or crack
$\Delta BLj < \Delta BLK1$: deflection
Secondary Judgment
$\Delta BLj \geq \Delta BLk2$: normal peel
$\Delta Blj < \Delta BLk2$: crack Generally, the threshold value of the air leak flow rate is managed with a timer so as to judge with respect to the crack, and the processing time is prolonged by an amount corresponding to the waiting period of the timer. The embodiment is capable of judging with respect to the crack and deflection quickly. The quick judgment may reduce the processing time and improve the throughput.

Figure 8:
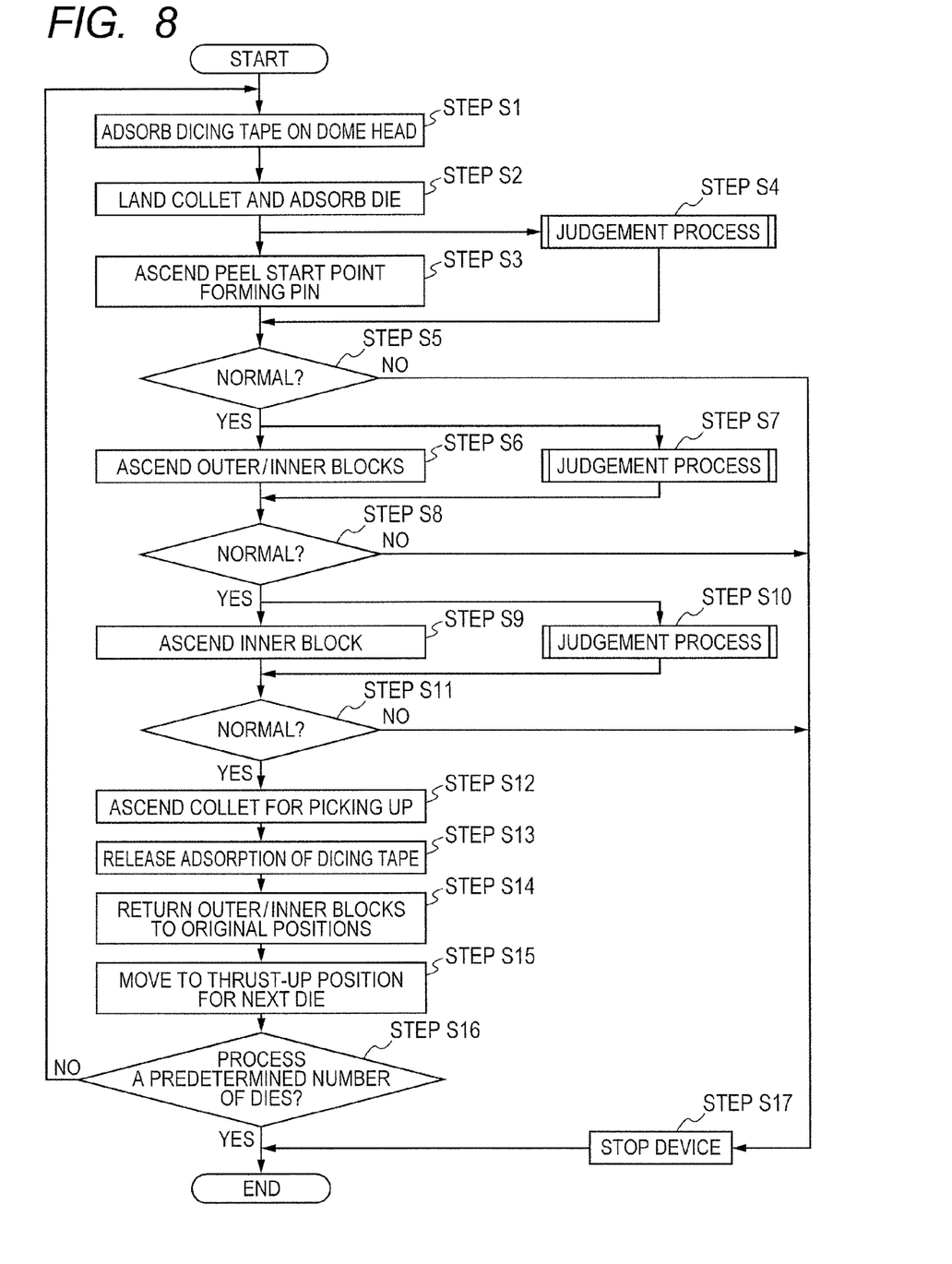
FIG. 8 is a flowchart representing a pickup process flow of the embodiment.
Figure 9:
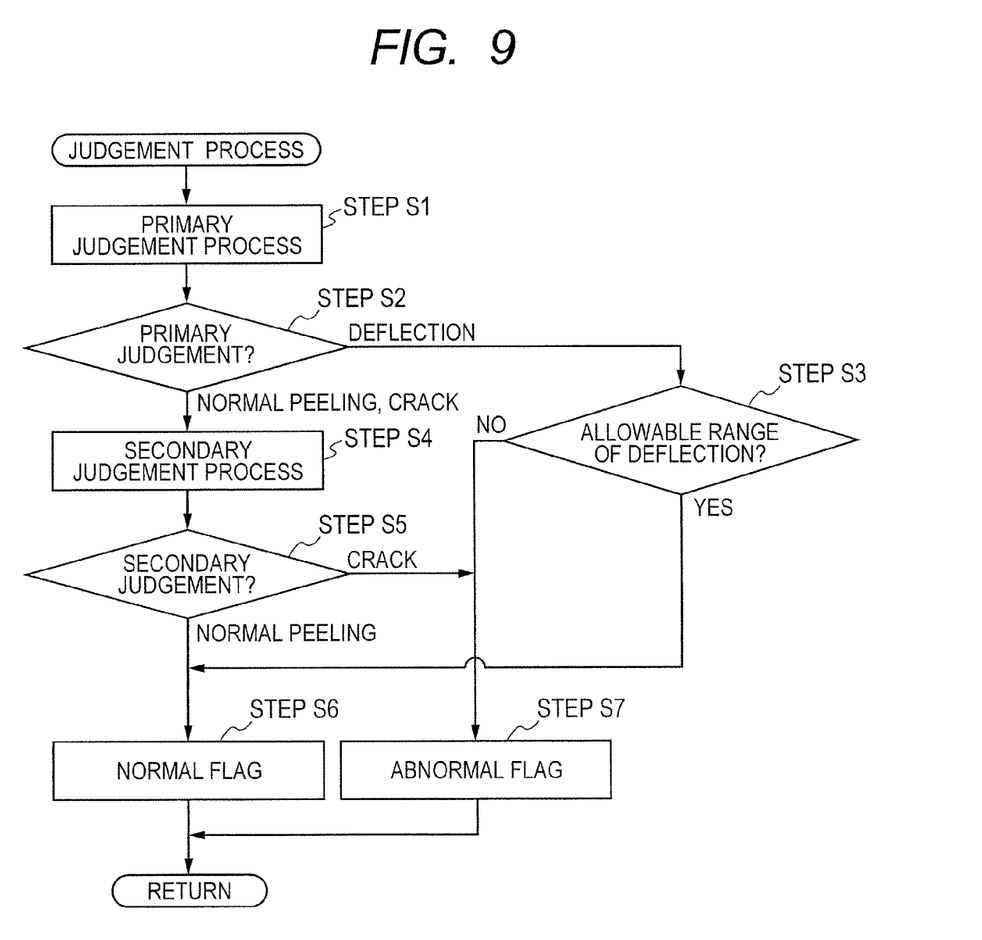
FIG. 9 is a flowchart representing a process for judgment with respect to the normal peel, crack and deflection of the die when it is thrust up based on the principle represented by FIG. 7.

FIG. 8 is a flowchart of the pickup process steps. FIG. 9 is a flowchart as a sub-routine of the process shown in FIG. 8, which will be executed for judgment with respect to the normal peel, crack and deflection upon thrust-up of the die based on the principle shown in FIG. 7.

The dicing tape 16 is adsorbed to the dome head 58b (step 1). The collet 42 is landed on the die 4 so as to be adsorbed (step 2). Thereafter, the peel start point forming pins 51 are ascended to form the peel start point (step 3). A judgment is made with respect to the normal peel, crack and deflection in step 4 parallel to the process for forming the peel start point (step 4). In the judgment step shown in FIG. 9, the primary judgment process as described referring to FIG. 7 is executed (step S1). If it is judged that the deflection has occurred based on the result of the primary judgment process (step S2), it is further judged whether or not the deflection is in an allowable range (step S3). If the deflection is in the allowable range, it is judged that the peel is normally done, and a normal flag is set (step S6). If the deflection is not in the allowable range, an abnormal flag is set (step S7).

If it is judged that the peel has been normally done or the crack has occurred in step S2, the secondary judgment process is executed (step S4). If it is judged that the peel has been normally done based on the result of the secondary judgment process (step S5), the normal flag is set (step S6), and the process returns to the main routine. If it is judged that the crack has occurred, the abnormal flat is set (step S7), and the process returns to the main routine.

Upon return to the main routine, it is judged whether the process may be continuously executed based on the normal and abnormal flags (step 5). If the abnormal flag is set, the device is stopped (step 17). If the normal flag is set, the outer block 52 and the inner block 54 are ascended together (step 6), and steps 7, 8 and 17 are executed likewise the steps 4, 5 and 17 which are executed when the peel start point is formed.

If it is judged that the peel has been normally done in step 8, the inner block 54 is ascended (step 9), and steps 10, 11 and 17 are executed likewise the steps 4, 5 and 17 which are executed when the peel start point is formed.

If it is judged that the peel has been normally done in step 11, the collet 42 is ascended to pick up the die 4 (step 12). Thereafter, the adsorption of the dicing tape is released (step 13), and the outer block and the inner block are returned to the original heights (step 14). The thrust-up unit 50 is moved to the position where the next die is thrust up (step 15). Finally, it is judged whether a predetermined number of dies have been processed (step 16), and the process ends.

The embodiment as described above provides the highly reliable die bonder and the bonding method which allow judgment with respect to occurrence of the deflection if no crack occurs upon pickup of the die.

The embodiment as described above provides the die bonder and the bonding method with high yield, which are capable of judging with respect to the die that returns to the normal state even if the deflection occurs.

The embodiment as described above provides the die bonder and the bonding method with low throughput, which accelerate the transition to the next operation to shorten the processing time as the judgment with respect to occurrence of the crack and deflection is made at an earlier stage.

In the embodiment as described above, after formation of the peel start point using the peel start point forming pins, the outer block and the inner block are ascended. However, the embodiment is applicable to the type that peels using a large number of pins as disclosed in JP-A No. 2002-184836.

The embodiments according to the present invention have been described. It is to be understood that the present invention may be made into an alternative form, corrected, and modified based on the description. The present invention contains an alternative examples, correction or modification as described above within a scope of the present invention.

What is claimed is:

1. A bonding method comprising:
an adsorbing step of adsorbing a die using a collet;
a thrust-up step of thrusting up a dicing tape to which the die is adsorbed;
a peeling step of peeling the die, which is adsorbed by the collet and is thrust up, from the dicing tape;
a bonding step of bonding the peeled die to the substrate; and
a first judgment step of judging that a deflection occurs in the die when a decrease rate in an air leak flow rate through a gap between the collet and the die upon the thrust up is smaller than the decrease rate in a normal peel by a predetermined amount after the air leak flow rate is reversed from increase to decrease.

2. The bonding method according to claim 1, wherein the first judgment step judges the decrease rate in the air leak flow rate based on a differential value.

3. The bonding method according to claim 1, further comprising a second judgment step, which judges that a crack occurs in the die when the air leak flow rate becomes constant or substantially constant.

4. The bonding method according to claim 1, wherein the first judgment step judges that the peel is normally done in spite of a deflection when the air leak flow rate becomes equal to or smaller than a first predetermined value, or the decrease in the air leak flow rate is equal to or smaller than a second predetermined value within a predetermined time.

5. The bonding method according to claim 1, wherein:
a peel start point is formed by thrusting up the dicing tape at a predetermined portion of a peripheral portion of the die; and
the first judgment step is executed when forming the peel start point.

6. The bonding method according to claim 3, wherein:
a peel start point is formed by thrusting up the dicing tape at a predetermined portion of a peripheral portion of the die; and
the first judgment step is executed when forming the peel start point.

7. The bonding method according to claim 3, wherein the peel start point is formed at the predetermined portion provided at least at one corner portion of four corner portions of the die.

* * * * *